United States Patent
Dickman et al.

(10) Patent No.: US 7,323,936 B2
(45) Date of Patent: Jan. 29, 2008

(54) INPUT CIRCUIT FOR RECEIVING AN INPUT SIGNAL, AND A METHOD FOR ADJUSTING AN OPERATING POINT OF AN INPUT CIRCUIT

(75) Inventors: Rory Dickman, Graz (AT); Helmut Fischer, Oberhaching (DE)

(73) Assignee: Infineon Technologies AG, Munich (DE)

( * ) Notice: Subject to any disclaimer, the term of this patent is extended or adjusted under 35 U.S.C. 154(b) by 200 days.

(21) Appl. No.: 11/128,625

(22) Filed: May 13, 2005

(65) Prior Publication Data

US 2005/0270101 A1 Dec. 8, 2005

(30) Foreign Application Priority Data

May 14, 2004 (DE) .................. 10 2004 024 082

(51) Int. Cl.
H03F 3/45 (2006.01)
G06G 7/12 (2006.01)
(52) U.S. Cl. ...................... 330/261; 327/563
(58) Field of Classification Search ............... None
See application file for complete search history.

(56) References Cited

U.S. PATENT DOCUMENTS

| | | | | |
|---|---|---|---|---|
| 3,440,554 A | * | 4/1969 | Graeme et al. | 330/258 |
| 3,444,476 A | * | 5/1969 | Liedich | 330/69 |
| 4,442,408 A | * | 4/1984 | Le | 330/261 |
| 4,460,873 A | * | 7/1984 | Hester | 330/259 |
| 5,999,050 A | * | 12/1999 | Baltus | 330/252 |
| 7,009,420 B2 | | 3/2006 | Schaefer | |

OTHER PUBLICATIONS

German Patent Office Examination Report dated Jan. 24, 2005.
Ulrich Tietze and Christoph Schenk, Semiconductor Circuit Technology, 11th edition, Berlin [et al.]: Springer, pp. 399-401, ISBN 3-540-64192-0, 1999.

* cited by examiner

*Primary Examiner*—Robert Pascal
*Assistant Examiner*—Krista M Flanagan
(74) *Attorney, Agent, or Firm*—Patterson & Sheridan, L.L.P.

(57) ABSTRACT

The present invention relates to an input circuit for receiving an input signal in an integrated circuit, having a differential amplifier whose first input can have a predetermined reference voltage applied to it and whose second input can have the input signal applied to it, and having a current source for operating the differential amplifier at its operating point, wherein a setting circuit is connected to the current source in order to set the operating point of the differential amplifier in an optimum manner on the basis of the predetermined reference voltage.

24 Claims, 2 Drawing Sheets

INPUT CIRCUIT FOR RECEIVING AN INPUT SIGNAL, AND A METHOD FOR ADJUSTING AN OPERATING POINT OF AN INPUT CIRCUIT

CROSS-REFERENCE TO RELATED APPLICATIONS

This application claims foreign priority benefits under 35 U.S.C. §119 to co-pending German patent application number DE 10 2004 024 082.5, filed 14 May 2004. This related patent application is herein incorporated by reference in its entirety.

BACKGROUND OF THE INVENTION

1. Field of the Invention

The invention relates to an input circuit for receiving an input signal in an integrated circuit. The invention also relates to a method for adjusting the operating point of an input circuit.

2. Description of the Related Art

Integrated circuits have input circuits for the purpose of receiving input signals. The input circuits assess the input signals with respect to a reference voltage that is usually prescribed externally. The external reference voltage is subject to fluctuations which stem from noise effects, signal cross-coupling or from simultaneous switching effects. The reference voltage deviates from its nominal value, in particular, when the integrated circuit is used in an overall system. These deviations result in the input circuit not being operated at its optimum operating point, thus adversely affecting the performance of the input circuit when receiving and assessing the input signal and adversely affecting the power consumption.

Conventional input circuits have a differential amplifier which is coupled to a current mirror such that the same current flows through both branches of the differential amplifier. One input of the differential amplifier is connected to the input signal and another input of the differential amplifier is connected to the reference voltage. However, if the reference voltages which are applied to one input of the differential amplifier differ, the optimum operating point is usually assumed only at the nominal reference voltage. If the applied reference voltage differs from the latter, the input circuit is not operated at the optimum operating point.

Therefore, there is a need for an input circuit which is intended to receive an input signal and can be operated in an optimum manner even when the applied reference voltage deviates. There is also a need for a method for adjusting the operating point of an input circuit.

SUMMARY OF THE INVENTION

A first aspect of the present invention provides an input circuit for receiving an input signal in an integrated circuit. The input circuit has a differential amplifier whose first input can have an external reference voltage applied to it and whose second input can have the input signal applied to it. A current source is also provided to operate the differential amplifier at its operating point. According to an embodiment of the invention, a setting circuit is connected to the current source to set the operating point of the differential amplifier in an optimum manner on the basis of the predetermined reference voltage.

The input circuit according to an embodiment of the invention has the advantage that the current source for operating the differential amplifier is set on the basis of the reference voltage provided. This makes it possible to set the differential amplifier to the optimum operating point, at which the input signal can be assessed as quickly as possible. If, when assessing the input signal, the differential amplifier is not at its optimum operating point because the reference voltage is greater than or less than the nominal reference voltage, a rising or falling edge of the input signal is not assessed quickly enough to satisfy the required specifications. The input signal applied is assessed as quickly as possible by matching the current through the differential amplifier to the applied reference voltage.

In line with one embodiment, the setting circuit has a voltage source which can be set in such a manner that it produces a control voltage on the basis of the external reference voltage, with it being possible to use the control voltage to control the current source.

The voltage source may set the control voltage at one or more prescribed points in time on the basis of the predetermined reference voltage.

In line with one embodiment, the setting circuit may have a multiplexer to provide a plurality of comparison voltages which are generated from the predetermined reference voltage, a comparator being provided in order to compare the plurality of comparison voltages, in succession, with the reference voltage provided and to set the voltage source on the basis of a result from the comparison.

In one embodiment of the invention, the voltage source may comprise a reference voltage source and a bias voltage source, the reference voltage source producing an internal reference voltage for the bias voltage source, and the bias voltage source generating the control voltage for the current source. The bias voltage source may, in particular, have a bandgap circuit in order to produce a control voltage that is independent of temperature.

To improve the performance of the input circuit, two differential amplifiers, which are respectively coupled to a current source, may be provided, with outputs of the differential amplifiers being connected to one another. In particular, a first differential amplifier may have a parallel arrangement comprising a first p-channel transistor for receiving the reference voltage that has been provided and a second p-channel transistor for receiving the input signal, with a first current source supplying the first differential amplifier. A second differential amplifier may also have a parallel arrangement comprising a first n-channel transistor for receiving the external reference voltage and a second n-channel transistor for receiving the input signal, with a second current source supplying the second differential amplifier.

A first and a second input setting circuit may be provided to supply the first and second current sources with different control voltages. Providing an input circuit which has two different differential amplifiers has the advantage that both the rising and the falling edge of the input signal can be received in an optimum manner and can be assessed as quickly as possible.

Another aspect of the present invention provides a method for adjusting an operating point of an input circuit. The input circuit has a differential amplifier whose first input can have a reference voltage—which has been provided—applied to it and whose second input can have the input signal applied to it. The operating current through the differential amplifier is set on the basis of the external reference voltage in such a manner that a suitable operating point is set in the differential amplifier.

In one embodiment, the operating point of the differential amplifier can be operated in the optimum range even in the case of a fluctuating reference voltage or in the case of a reference voltage that deviates from its nominal value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
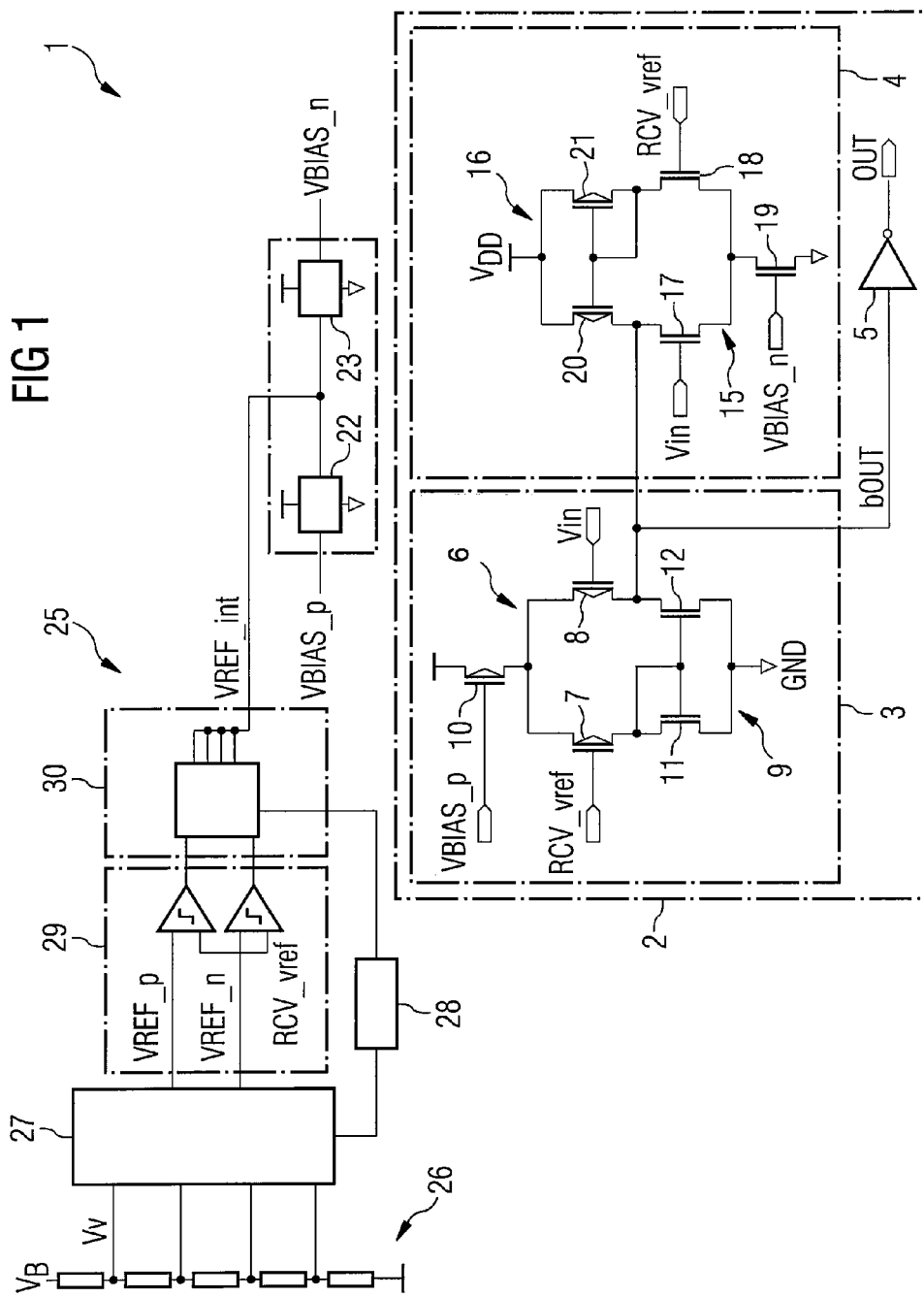
FIG. 1 shows a block diagram of an inventive input circuit.

FIG. 1 shows a circuit diagram of an input circuit for an integrated circuit for receiving an input signal to be assessed. The input circuit 1 has a reception part 2 which comprises a first reception circuit 3 and a second reception circuit 4. Each of the reception circuits 3, 4 receives the input signal to be assessed and outputs the assessed and inverted input signal $b_{out}$ at the outputs, which are connected to one another for the two reception circuits 3, 4, and forwards it to an inverter 5. The inverter 5 provides other circuits (not shown) in the integrated circuit with the amplified and assessed (non-inverted) input signal OUT.

The first reception circuit 3 has a first differential amplifier 6 which is designed in a known manner with a first p-channel transistor 7 and a second p-channel transistor 8. The first differential amplifier 6 is coupled to a first current mirror circuit 9 in such a manner that the current through the first p-channel transistor 7 is mirrored in the second p-channel transistor 8. A control connection of the first p-channel transistor 7 is connected to a reference voltage RCV_vref that has been provided. The reference voltage RCV_vref provided is usually made available to the integrated circuit externally and is used to assess the input signal $V_{in}$ that has been applied. The assessment is generally effected in such a manner that the input signal is assigned a first state when the input signal $V_{in}$ is greater than the reference voltage RCV_vref provided and is assigned a second state when the input signal $V_{in}$ is less than the reference voltage RCV_vref provided.

Specifically, the first reception circuit 3 is designed in such a manner that the source connection of the first p-channel transistor 7 is connected to a first current source 10. A drain connection of the first p-channel transistor is connected to a drain connection of a first current mirror transistor 11 in the first current mirror circuit 9. The drain connection of the first p-channel field effect transistor 7 is also connected to the control connection of the first current mirror transistor 11. A source connection of the first current mirror transistor 11 is connected to a ground potential GND. A second current mirror transistor 12 is provided in the first current mirror circuit 9, the source connection of said second current mirror transistor likewise being connected to the ground potential GND and being connected to a drain connection of the second p-channel field effect transistor 8, and the drain connection simultaneously forming the output of the first reception circuit 3. A source connection of the second p-channel field effect transistor 8 is connected to the current source 10.

The current source 10 is in the form of a p-channel field effect transistor which sets the overall current through the first differential amplifier 6 and the first current mirror 9. The p-channel field effect transistor of the current source 10 is driven by means of a first control voltage VBIAS_p which can be used to set the current through the first reception circuit 3.

The second reception circuit 4 is essentially of analog design. It has a second differential amplifier 15 which is coupled to a second current mirror circuit 16 in such a manner that the same current flows through both branches of the second differential amplifier 15. The second differential amplifier 15 has a first n-channel field effect transistor 17 and a second n-channel field effect transistor 18. The input signal is applied to a control input (gate connection) of the first n-channel field effect transistor 17, and the reference voltage RCV_vref provided is applied to a control input of the second n-channel field effect transistor 18 in the second differential amplifier 15. The source connections of the first and second n-channel field effect transistors 17, 18 are connected to a second current source 19. The second current source 19 is in the form of an n-channel field effect transistor whose control connection has a second control voltage VBIAS_n applied to it. The second current mirror 16 has a third current mirror transistor 20 and a fourth current mirror transistor 21. The drain connection of the first current mirror transistor 20 is coupled to the drain connection of the first n-channel field effect transistor 17 and simultaneously constitutes the output of the second reception circuit 4. A drain connection of the fourth current mirror transistor 21 is connected to a drain connection of the second n-channel field effect transistor 18. The drain connection of the fourth current mirror transistor 21 is also coupled to the control connections of the third and fourth current mirror transistors 20, 21. The source connections of the third and fourth current mirror transistors 20, 21 are connected to the high supply voltage potential VDD.

In conventional input circuits, the first control voltage VBIAS_p and the second control voltage VBIAS_n are generated independently of the reference voltage RCV_vref (which has been provided), for example using "bandgap circuits". A first bandgap circuit 22 provides the first control voltage VBIAS_p, and a second bandgap circuit 23 provides a second control voltage VBIAS_n. The bandgap circuits 22, 23 generate the control voltages independently of temperature and independently of the supply voltage applied. If the reference voltage then deviates from its nominal value, this results, in conventional input circuits, in the relevant transistor in the respective differential amplifier, that is to say the first p-channel field effect transistor 7 and the second n-channel field effect transistor 18, being operated outside the predetermined operating point, since the control voltages remain unchanged. The predetermined operating point of these transistors is assumed when the nominal reference voltage is applied.

If both or one of the reception circuits 3, 4 is/are operated outside its/their operating point because the applied reference voltage RCV_vref deviates from its nominal value, the invention provides for the control voltages VBIAS_p, VBIAS_n to be adjusted by setting the respective current source 10, 19 in such a manner that the current through the differential amplifier 6, 15 is changed such that an optimum operating point is assumed for the deviating reference voltage RCV_vref provided. The optimum operating point can be selected with regard to various criteria. However, the performance of the input circuit is usually the main criterion, that is to say the speed at which the applied input signals can be assessed or the speed at which a state change in the input signal OUT (which has been provided and assessed) on account of a state change in the input signal $V_{in}$ is output.

In order to set the control voltage, the bandgap circuits 22, 23 are provided with an internal reference voltage VREF_int which is taken as the basis for generating the first and second control voltages VBIAS_p, VBIAS_n. The setting circuit 25 has a voltage divider which divides an internal reference voltage VB in order to define voltage ranges. The voltage divider 26 provides a plurality of comparison voltages $V_v$ which are supplied to a multiplexer 27 which provides a comparator 29 with the comparison voltages under the control of a control unit 28.

The comparator 29 receives two successive comparison voltages $V_v$, the upper comparison voltage VREF_p and the lower comparison voltage VREF_n, from the multiplexer 27. Said voltages are compared with the externally provided reference voltage RCV_vref that is applied, and a voltage generator 30 is provided with the result. If the external reference voltage is above the upper comparison voltage VREF_p, the internal reference voltage VREF_int generated by the voltage generator 30 is increased incrementally, that is to say by a predetermined amount; if the external reference voltage RCV_vref is between the upper comparison voltage and the lower comparison voltage, the internal reference voltage VREF_int is not changed, and if the external reference voltage RCV_vref is below the lower reference voltage threshold VREF_n, the internal reference voltage VREF_int is reduced by a predetermined amount.

The internal reference voltage VREF_int is supplied to the bandgap circuits 22, 23 which are controlled on the basis of the first control voltage VBIAS_p and the second control voltage VBIAS_n in order to set the respective operating point of the first reception circuit 3 and of the second reception circuit 4 in an optimum manner.

The setting circuit 25 essentially causes the external reference voltage RCV_vref to be assessed and to be assigned to an internal reference voltage VREF_int which essentially determines the range within which the external reference voltage RCV_vref may vary without it being necessary to change the operating point of the relevant reception circuit 3, 4. The adjustment can be carried out at regular intervals under the control of the control unit 28. However, the adjustment cycles need to be selected in such a manner that brief interference with the external reference voltage RCV_vref does not result in the internal reference voltage VREF_int being adjusted. Adjusting the operating point essentially concerns a longer-lasting deviation by the external reference voltage RCV_vref from the nominal value to which the reception circuits have been set.

The setting circuit makes it possible to reduce the power consumption of the input circuit by reducing the operating currents through the reception circuits 3, 4 in order to set the operating point in an optimum manner without impairing the performance of the reception circuit.

Figure 2:
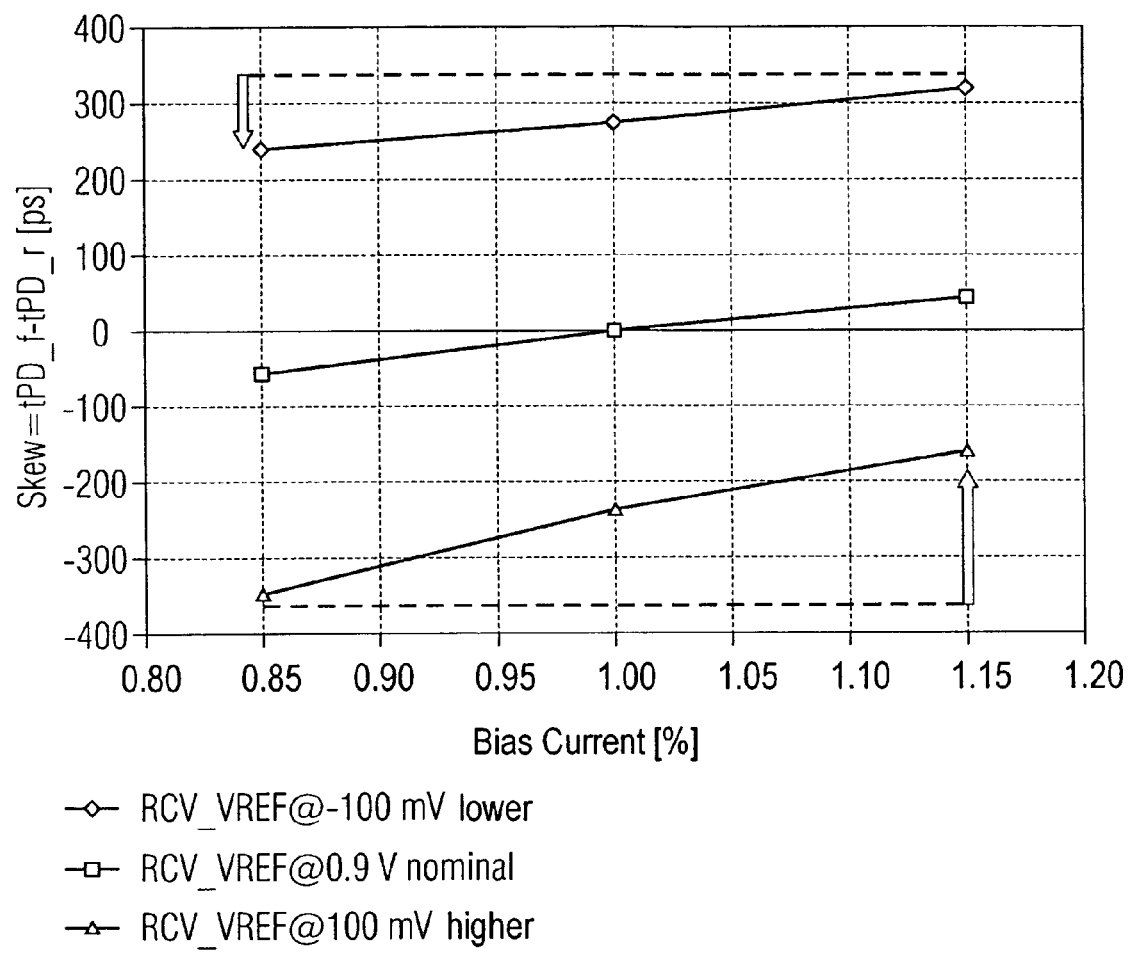
FIG. 2 shows a graph for illustrating the dependence of the skew on the percentage deviation by the differential amplifier's operating current.

FIG. 2 shows a graph showing the dependence of the skew between the rising and falling edges on the percentage shift in the operating current through the reception circuits, the reference voltage RCV_vref provided being given as parameter. The three straight lines shown represent the profile of the skew between the rising and falling edges for a reference voltage that has been reduced by 100 mV, a nominal reference voltage and a reference voltage that has been increased by 100 mV.

While the foregoing is directed to embodiments of the present invention, other and further embodiments of the invention may be devised without departing from the basic scope thereof, and the scope thereof is determined by the claims that follow.

What is claimed is:

1. An input circuit for receiving an input signal in an integrated circuit, comprising:
    a differential amplifier having a first input for receiving a predetermined reference voltage and a second input for receiving the input signal, and having a current source for operating the differential amplifier at an operating point; and
    a setting circuit connected to the current source and configured to adjust the operating point of the differential amplifier on the basis of the predetermined reference voltage, wherein the setting circuit is configured to adjust the operating point independently from an output of the differential amplifier.

2. The input circuit of claim 1, wherein the setting circuit comprises a voltage source configured to produce a control voltage on the basis of the predetermined reference voltage, the control voltage being applied to the current source to control the current source.

3. The input circuit of claim 2, further comprising a comparator configured to compare the predetermined reference voltage to an upper limit value and a lower limit value for the predetermined reference voltage and wherein the voltage source is configured to adjust the control voltage when the predetermined reference voltage is not between the upper limit value and the lower limit value.

4. The input circuit of claim 2, wherein the setting circuit comprises:
    a multiplexer configured to provide a plurality of comparison voltages which are generated from the predetermined reference voltage; and
    a comparator configured to compare the plurality of comparison voltages with the predetermined reference voltage provided and to set the voltage source on the basis of a result from the comparison.

5. The input circuit of claim 2, wherein the voltage source comprises a reference voltage source and a bias voltage source, the reference voltage source being configured to produce an internal reference voltage for the bias voltage source, and the bias voltage source generating the control voltage for the current source.

6. The input circuit of claim 5, wherein the bias voltage source comprises a bandgap circuit.

7. An input circuit for receiving an input signal in an integrated circuit, comprising:
    at least two differential amplifiers each comprising a first input for receiving a predetermined reference voltage, a second input for receiving the input signal, a current source for operating the respective differential amplifier at a respective operating point and an output, the respective outputs of the differential amplifiers being connected to one another; and
    a setting circuit connected to both the respective current sources and configured to adjust both the respective operating points of the respective differential amplifiers on the basis of the predetermined reference voltage as the predetermined reference voltage varies.

8. The input circuit of claim 7, wherein the setting circuit comprises a voltage source configured to produce respective control voltages on the basis of the predetermined reference voltage, the control voltages being applied to the respective current sources to control the respective current sources.

9. The input circuit of claim 7, wherein a first differential amplifier has a parallel arrangement comprising a first p-channel transistor for receiving the predetermined reference voltage and a second p-channel transistor for receiving the input signal, with a first current source of the first differential amplifier, the first current source being coupled to the voltage source to receive a respective control voltage; and wherein a second differential amplifier has a parallel arrangement comprising a first n-channel transistor for receiving the predetermined reference voltage and a second n-channel transistor for receiving the input signal, with a respective second current source of the second differential amplifier, the second current source being coupled to voltage source to receive a respective control voltage.

10. The input circuit of claim 7, wherein the setting circuit is configured to provide the respective current sources with different control voltages.

11. The input circuit of claim 8, further comprising a comparator configured to compare the predetermined reference voltage to an upper limit value and a lower limit value for the predetermined reference voltage and wherein the voltage source is configured to adjust the respective control voltages when the predetermined reference voltage is not within between the upper limit value and the lower limit value.

12. The input of claim 8, wherein the setting circuit comprises:
a multiplexer configured to provide a plurality of comparison voltages which are generated from the predetermined reference voltage; and
a comparator configured to compare the plurality of comparison voltages with the predetermined reference voltage provided and to set the voltage source on the basis of a result from the comparison.

13. The input circuit of claim 8, wherein the voltage source comprises a reference voltage source, a first bias voltage source connected to a first one of the differential amplifiers and a second bias voltage source connected to a second one of the differential amplifiers, the reference voltage source being configured to produce an internal reference voltage for the bias voltage sources, and the respective bias voltage sources generating the control voltages for the respective current sources.

14. A method for adjusting an operating point of an input circuit comprising a differential amplifier having a first input for receiving a reference voltage and a second input for receiving the input signal applied to it, the method comprising:
responsive to changes of the reference voltage, adjusting an operating current applied to the differential amplifier, thereby regulating the operation of the differential amplifier within a desired operational range, wherein adjustment of the operating current applied to the differential amplifier is performed independently from an output of the differential amplifier.

15. The method of claim 14, wherein adjusting the operating current comprises:
producing a control voltage on the basis of the reference voltage; and
applying the control voltage to a current source, the current source responsively performing the adjusting of the operating current.

16. The method of claim 15, further comprising:
generating a plurality of comparison voltages on the basis of the reference voltage;
comparing the plurality of comparison voltages with the reference voltage; and
setting a voltage source on the basis of a result of the comparison, the voltage source being configured to produce the control voltage.

17. The method of claim 15, further comprising:
comparing the reference voltage to an upper limit value and a lower limit value for the reference voltage; and
adjusting the control voltage with the reference voltage when the reference voltage is not between the upper limit value and the lower limit value.

18. The method of claim 15, wherein producing the control voltage comprises:
producing an internal reference voltage;
inputting the internal reference voltage to a bias voltage source; and
generating the control voltage by the bias voltage source on the basis of the input internal reference voltage.

19. An input circuit for receiving an input signal in an integrated circuit, comprising:
a differential amplifier having a first input for receiving a predetermined reference voltage and a second input for receiving the input signal, and having a current source for operating the differential amplifier at an operating point; and
a setting circuit connected to the current source and configured to adjust the operating point of the differential amplifier on the basis of the predetermined reference voltage, wherein the setting circuit is configured to adjust the operating point independently from the output of the differential amplifier; and
a comparator configured to compare the predetermined reference voltage to an upper limit value and a lower limit value for the predetermined reference voltage and wherein the voltage source is configured to adjust the control voltage when the predetermined reference voltage is not between the upper limit value and the lower limit value.

20. The input circuit of 19, wherein the setting circuit comprises:
a multiplexer configured to provide a plurality of comparison voltages which are generated from the predetermined reference voltage; and
a comparator configured to compare the plurality of comparison voltages with the predetermined reference voltage provided and to set the voltage source on the basis of a result from the comparison.

21. An input circuit for receiving an input signal in an integrated circuit, comprising:
a differential amplifier having a first input for receiving a predetermined reference voltage and a second input for receiving the input signal, and having a current source for operating the differential amplifier at an operating point; and
a setting circuit connected to the current source and configured to adjust the operating point of the differential amplifier on the basis of the predetermined reference voltage, wherein the setting circuit comprises a voltage source configured to produce a control voltage on the basis of the predetermined reference voltage, the control voltage being applied to the current source to control the current source, wherein the voltage source comprises a reference voltage source and a bias voltage source, the reference voltage source being configured to produce an internal reference voltage for the bias voltage source, and the bias voltage source generating the control voltage for the current source.

22. The input circuit of claim 21, further comprising a comparator configured to compare the predetermined reference voltage to an upper limit value and a lower limit value for the predetermined reference voltage and wherein the voltage source is configured to adjust the control voltage when the predetermined reference voltage is not between the upper limit value and the lower limit value.

23. The input circuit of claim 21, wherein the bias voltage source comprises a bandgap circuit.

24. A method for adjusting an operating point of an input circuit comprising a differential amplifier having a first input for receiving a reference voltage and a second input for receiving the input signal applied to it, the method comprising:

responsive to changes of the reference voltage, adjusting an operating current applied to the differential amplifier, thereby regulating the operation of the differential amplifier within a desired operational range;

comparing the predetermined reference voltage to an upper limit value and a lower limit value for the reference voltage; and adjusting a control voltage with the reference voltage when the reference voltage is not between the upper limit value and the lower limit value, the control voltage being applied to a current source which responsively performs the adjusting of the operating current.

* * * * *

UNITED STATES PATENT AND TRADEMARK OFFICE
CERTIFICATE OF CORRECTION

PATENT NO. : 7,323,936 B2
APPLICATION NO. : 11/128625
DATED : January 29, 2008
INVENTOR(S) : Rory Dickman et al.

It is certified that error appears in the above-identified patent and that said Letters Patent is hereby corrected as shown below:

In the Claims Section:

In Claim 24, at Column 10, Line 6, please delete "predetermined".

Signed and Sealed this

Nineteenth Day of August, 2008

JON W. DUDAS
*Director of the United States Patent and Trademark Office*